(12) United States Patent
Taniguchi et al.

(10) Patent No.: US 7,012,397 B2
(45) Date of Patent: Mar. 14, 2006

(54) ENCODER AND CONTROL APPARATUS FOR MOTOR

(75) Inventors: Mitsuyuki Taniguchi, Gotenba (JP); Keisuke Imai, Minamitsuru-gun (JP); Ichirou Nagatomo, Minamitsuru-gun (JP); Shinichi Horikoshi, Minamitsuru-gun (JP); Takashi Harada, Minamitsuru-gun (JP)

(73) Assignee: Fanuc LTD, Yamanashi (JP)

(*) Notice: Subject to any disclaimer, the term of this patent is extended or adjusted under 35 U.S.C. 154(b) by 0 days.

(21) Appl. No.: 11/061,544

(22) Filed: Feb. 18, 2005

(65) Prior Publication Data

US 2005/0182591 A1    Aug. 18, 2005

(30) Foreign Application Priority Data

Feb. 18, 2004 (JP) ............................. 2004-041637

(51) Int. Cl.
*H02P 5/00* (2006.01)
*H03M 1/48* (2006.01)

(52) U.S. Cl. .................. 318/601; 318/602; 341/115; 341/116

(58) Field of Classification Search ........ 318/600–608, 318/616–618, 661, 594; 341/1, 11, 115, 341/116
See application file for complete search history.

(56) References Cited

U.S. PATENT DOCUMENTS

| 4,599,547 | A | * | 7/1986 | Ho .............................. 318/594 |
| 4,691,192 | A | | 9/1987 | Baker |
| 5,023,924 | A | * | 6/1991 | Tajima et al. ............... 388/811 |
| 5,721,546 | A | | 2/1998 | Tsutsumishita |
| 6,591,217 | B1 | | 7/2003 | Baur et al. |
| 6,756,582 | B1 | * | 6/2004 | Stridsberg .............. 250/231.13 |
| 6,950,769 | B1 | * | 9/2005 | Ito et al. ..................... 702/104 |
| 2003/0213896 | A1 | * | 11/2003 | Stridsberg .............. 250/231.13 |
| 2005/0127906 | A1 | * | 6/2005 | Miyashita et al. ..... 324/207.25 |
| 2005/0135135 | A1 | * | 6/2005 | Sharma et al. ................ 365/49 |

FOREIGN PATENT DOCUMENTS

EP             1 103 790 A2    5/2001

OTHER PUBLICATIONS

*European Search Report dated Jul. 12, 2005.

* cited by examiner

*Primary Examiner*—Paul Ip
(74) *Attorney, Agent, or Firm*—Drinker Biddle & Reath LLP

(57) ABSTRACT

In a control apparatus, a "characteristic value calculation" block calculates a characteristic value (such as amplitude value, offset value, or waveform distortion for each phase of two-phase sinusoidal signals optically input from an encoder, or phase difference between the two phase signals) for each of the two-phase sinusoidal signals, and an "alarm detection" block checks the presence or absence of an excursion outside a predetermined allowable range and, if such an excursion is detected, produces an alarm indication or the like. Each time the "present characteristic value" is input, a "characteristic value comparison" block compares it with "previous characteristic values", and analyzes the result of the comparison. That is, the difference between the present value and each previous data is calculated, and the largest amount of variation (with plus or minus sign) is obtained; if this amount is larger than a predetermined value, a signal indicating an "imminent failure" is output. In an alternative method, the present value is compared with a characteristic value calculated from an encoder reference signal. Further, the characteristic value monitoring and comparison may be performed within the encoder. In this way, data useful for the prediction of encoder failure, etc. is provided.

16 Claims, 6 Drawing Sheets

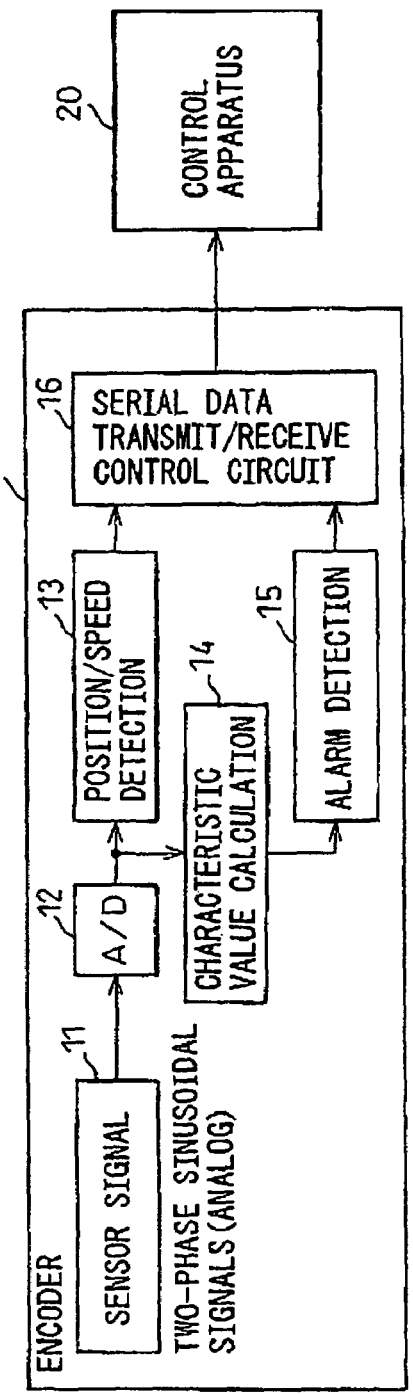
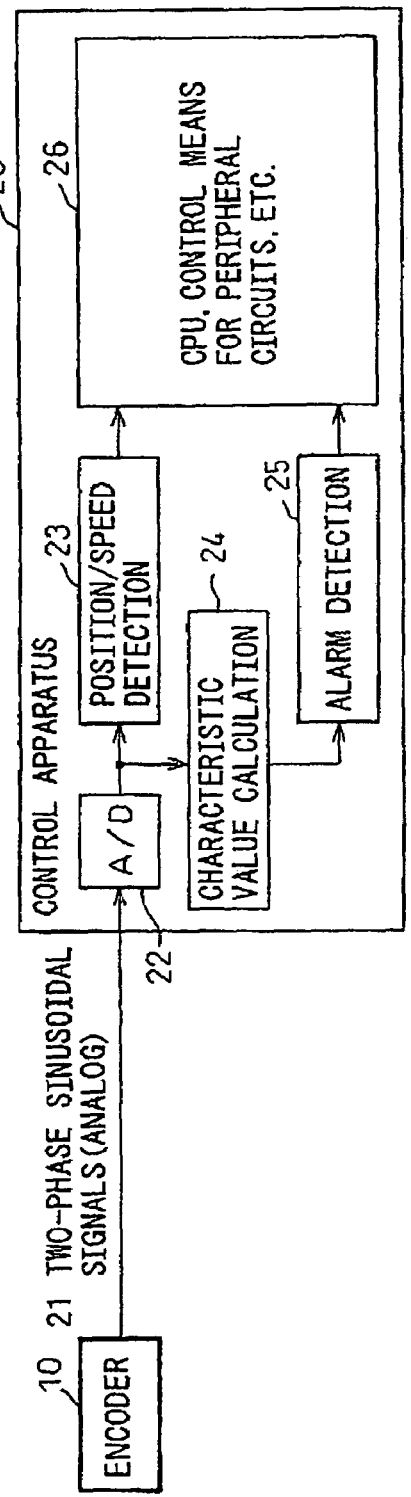
Fig.1a Prior Art
Fig.1b Prior Art

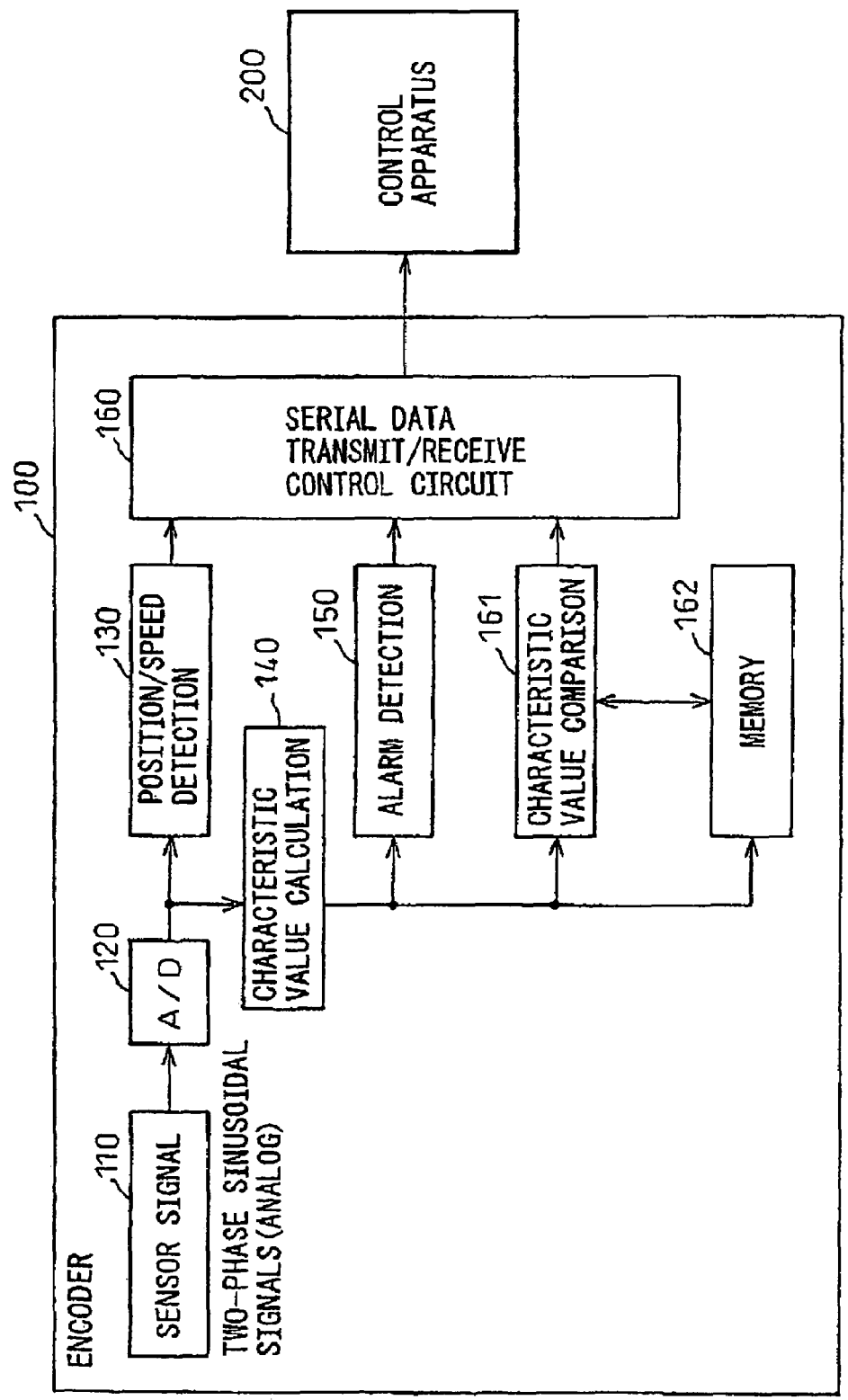

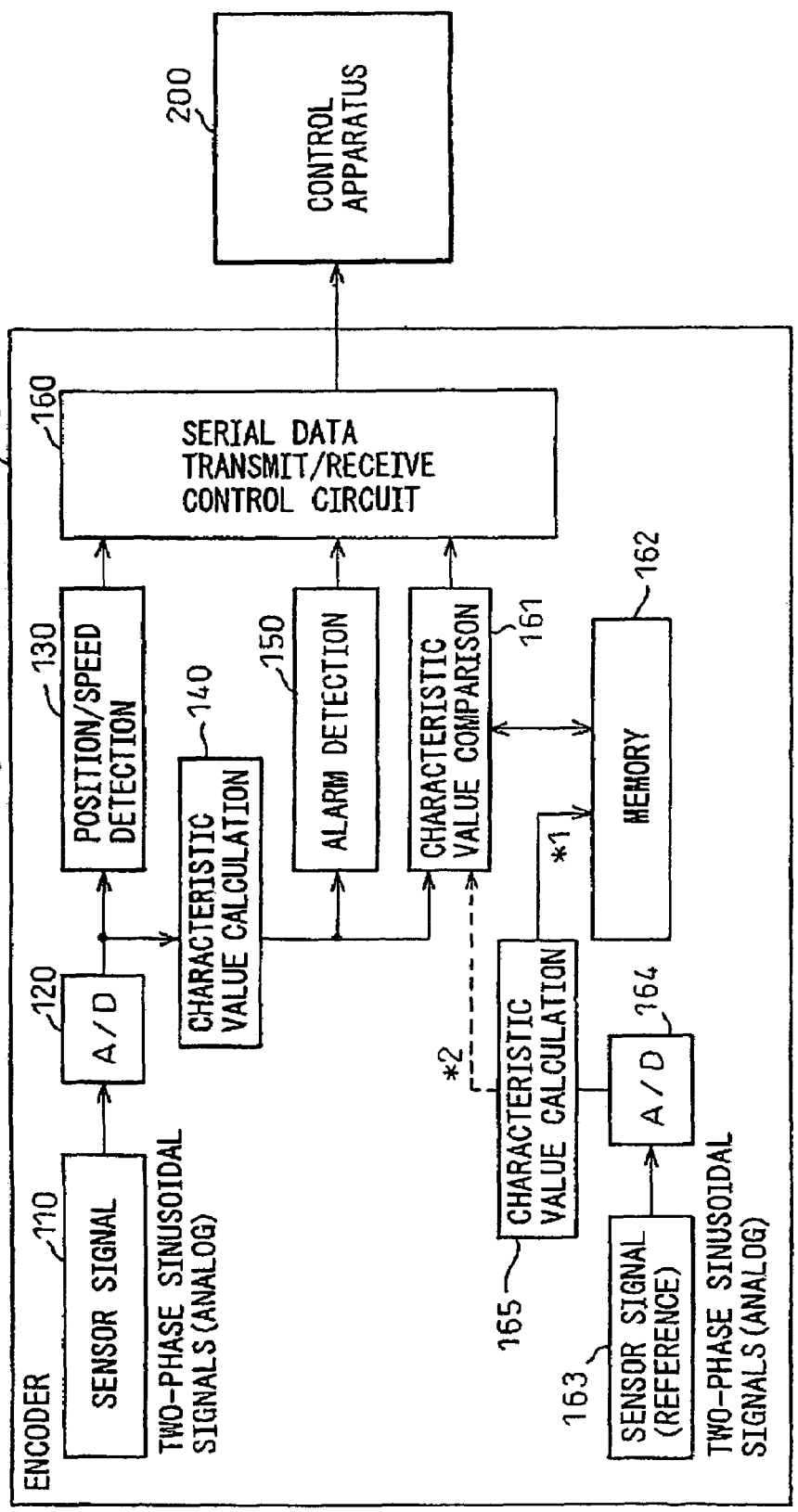

ENCODER AND CONTROL APPARATUS FOR MOTOR

BACKGROUND OF THE INVENTION

1. Field of the Invention

The present invention relates to an encoder, to be attached to a motor or a motor-driven apparatus and to be used for detecting position information or speed information, and to a control apparatus for controlling the motor by receiving and analyzing an analog encoder signal generated within the encoder; more particularly, the invention relates to a technology for providing information useful for the prediction of failure of the encoder.

2. Description of the Related Art

In an encoder attached to a motor or a motor-driven apparatus and used for detecting position information or speed information, failure can occur due to various internal or external factors or due to aging. To cope with the occurrence of such a failure, various techniques have been employed in the prior art, including one such as depicted in the configuration shown in the block diagram of FIG. 1a or 1b which outputs alarm information and notifies the operator accordingly by producing an audible alarm and/or presenting an alarm indication, for example, on a display of a control apparatus.

In the configuration shown in FIG. 1a, an analog sensor signal 11 generated by a detector (not shown) of an optical or magnetic encoder 10 is converted in a block 12 into a digital signal which is supplied to a position/speed detection circuit ("position/speed detection" block 13) and a "characteristic value calculation" block 14. As is well known, the sensor signal 11 contains signals of multiple channels such as two-phase sinusoidal signals (phase A and phase B). The "position/speed detection" block 13 obtains position/speed information based on these signals, and transmits the information to an external control apparatus 20 via a serial data transmit/receive control circuit 16. Based on the transmitted position/speed information, the control apparatus 20 performs feedback control, etc. of the motor (not shown) connected to the control apparatus.

On the other hand, in the "characteristic value calculation" block 14, a characteristic value (for example, the offset value of each phase signal) is calculated repeatedly for each of the two-phase sinusoidal signals at predetermined intervals of time, and the presence or absence of abnormality is checked in an "alarm detection" block 15. For example, an allowable range (from lower limit Vth1 to upper limit Vth2) is set in advance for the offset value, and whether the value is inside the allowable range or not is indicated by outputting a "0" (the value is inside the allowable range) or a "1" (the value is outside the allowable range). This output data is transmitted to the external control apparatus 20 via the serial data transmit/receive control circuit 16. When the "1" signal (the value is outside the allowable range) is transmitted, the control apparatus 20 produces an alarm output and notifies the occurrence of abnormality to the operator by means of a visible and/or audible indication.

In the configuration shown in FIG. 1b, an analog encoder signal 21 containing the two-phase sinusoidal signals generated by a detector of an encoder 10 is transmitted to an external control apparatus 20. In the control apparatus 20, the received signal is A/D converted in a block 22, and position/speed information is obtained based on the A/D converted signal. Then, based on the position/speed information, in a block 26 indicated as "CPU, control means for peripheral circuits, etc." feedback control, etc. is performed for the motor (not shown) connected to the control apparatus 20.

On the other hand, the A/D converted encoder signal is also supplied to a "characteristic value calculation" block 24 where the characteristic value (for example, the offset value) of the encoder signal is calculated. The characteristic value (for example, the offset value) thus calculated is processed in an "alarm detection" block 25; if it is determined that an abnormality has occurred, an alarm output is produced so as to notify the operator of the occurrence of the abnormality by means of a visible and/or audible indication. The criterion for outputting the alarm is the same as that described with reference to FIG. 1a. That is, for the two-phase sinusoidal signals, for example, the offset value is checked at extremely short predetermined intervals of time (ITP) and, if the offset value is outside the predetermined allowable range (from lower limit Vth1 to upper limit Vth2), the alarm output is produced.

However, with these prior art techniques, it has been difficult to predict failures before outputting the alarm information. Further, according to an empirical rule, there can occur cases where the alarm is produced intermittently, for example, when the allowable range (from lower limit Vth1 to upper limit Vth2) is set relatively narrow, and there have been cases where the cause for it cannot be identified. No literature has been found that describes an effective means for solving such problems.

Accordingly, it is an object of the present invention to solve the above-described problems associated with the prior art. That is, the invention aims to improve an encoder which is attached to a motor or a motor-driven apparatus and used for detecting position information or speed information, or to improve a control apparatus for controlling the motor by receiving and analyzing an analog encoder signal generated within the encoder, and thereby to provide information useful for failure prediction and also information useful for identifying the cause for the intermittent alarm activation. By so doing, the invention also aims to improve the maintainability of the encoder.

SUMMARY OF THE INVENTION

The present invention solves the above problems by making provisions to be able to provide information that indicates the change occurring in the characteristic value of the encoder signal over time due to internal or external factors or due to aging.

The present invention is applied to an encoder (first to fifth aspects) to be attached to a motor or a motor-driven apparatus and used for detecting position information or speed information, and also to a control apparatus (sixth to 10th aspects) which receives and analyzes an analog encoder signal generated within an encoder that is attached to a motor or a motor-driven apparatus and used for detecting position information or speed information, and which thereby controls the motor.

First, the encoder according to the first aspect of the invention comprises: storage means for storing an encoder signal characteristic value obtained from a digital quantity into which an analog encoder signal generated within the encoder has been converted; comparison means for comparing the characteristic value stored in the storage means with a characteristic value obtained from a digital quantity into which a present encoder signal has been converted; and means for notifying a comparison result output from the comparison means to a control apparatus of the motor.

The encoder according to the second aspect of the invention comprises: means for generating an analog encoder signal that serves as a reference; storage means for storing a reference encoder signal characteristic value obtained from a digital quantity into which the reference encoder signal has been converted; comparison means for comparing the characteristic value stored in the storage means with a characteristic value obtained from a digital quantity into which an analog encoder signal generated within the encoder has been converted; and means for notifying a comparison result output from the comparison means to a control apparatus of the motor.

The encoder according to the third aspect of the invention comprises: means for generating an analog encoder signal that serves as a reference; comparison means for comparing a characteristic value, obtained from a digital quantity into which the reference encoder signal has been converted, with a characteristic value obtained from a digital quantity into which a present analog encoder signal generated within the encoder has been converted; and means for notifying a comparison result output from the comparison means to a control apparatus of the motor.

The encoder according to the fourth aspect of the invention comprises: storage means for storing an encoder signal characteristic value obtained from a digital quantity into which an analog encoder signal generated within the encoder has been converted; comparison means for comparing, at predetermined intervals of time, the characteristic value stored in the storage means with a characteristic value obtained from a digital quantity into which a present encoder signal has been converted; and means for notifying a comparison result output from the comparison means to a control apparatus of the motor.

In each of the above encoders, the analog encoder signal comprises two substantially sinusoidal signals approximately 90 degrees apart in phase, and the characteristic value can be taken to include at least one value selected from values representing amplitude, offset (the amount of displacement from zero point at the center of amplitude, displacement in the positive direction being taken as positive and displacement in the negative direction as negative; the same applies hereinafter), and waveform distortion of each of the two encoder signals and phase difference between the two encoder signals (fifth aspect).

Next, the control apparatus according to the sixth aspect of the invention comprises: storage means for storing an encoder signal characteristic value obtained from a digital quantity into which the encoder signal has been converted; comparison means for comparing the characteristic value stored in the storage means with an encoder signal characteristic value obtained from a digital quantity into which a present analog encoder signal generated within the encoder has been converted; and means for analyzing a comparison result output from the comparison means.

The control apparatus according to the seventh aspect of the invention comprises: storage means for storing an encoder signal characteristic value obtained from a digital quantity into which an analog reference encoder signal that serves as a reference has been converted; comparison means for comparing the characteristic value stored in the storage means with an encoder signal characteristic value obtained from a digital quantity into which a present analog encoder signal generated within the encoder has been converted; and means for analyzing a comparison result output from the comparison means.

The control apparatus according to the eighth aspect of the invention comprises: comparison means for comparing a reference encoder signal characteristic value obtained from a digital quantity into which an analog reference encoder signal that serves as a reference has been converted, with a characteristic value obtained from a digital quantity into which a present analog encoder signal generated within the encoder has been converted; and means for analyzing a comparison result output from the comparison means.

The control apparatus according to the ninth aspect of the invention comprises: storage means for storing an encoder signal characteristic value obtained from a digital quantity into which the encoder signal has been converted; comparison means for comparing, at predetermined intervals of time, the characteristic value stored in the storage means with a characteristic value obtained from a digital quantity into which a present encoder signal has been converted; and means for analyzing a comparison result output from the comparison means.

In each of the above motor control apparatuses, the analog encoder signal comprises two substantially sinusoidal encoder signals approximately 90 degrees apart in phase, and the characteristic value can be taken to include at least one value selected from values representing amplitude, offset, and waveform distortion of each of the two encoder signals and phase difference between the two encoder signals (10th aspect). In the present invention, it will be appreciated that the encoder may be a "rotary encoder" or a "linear encoder".

According to the present invention, for the encoder attached to a motor or a motor-driven apparatus and used for detecting position information or speed information, information useful for failure prediction and information useful for identifying the cause for the intermittent alarm activation can be easily obtained from the information that indicates the change occurring in the characteristic value of the encoder signal over time due to internal or external factors or due to aging. This also serves to improve the maintainability of the encoder.

These and other objects, features and advantages of the present invention will be more apparent in light of the detailed description of exemplary embodiments thereof as illustrated by the drawings.

BRIEF DESCRIPTION OF THE DRAWINGS

FIG. 1a is a block diagram showing a configuration example employed in the prior art in relation to the production of an alarm output that indicates the occurrence of encoder failure.

FIG. 1b is a block diagram showing a configuration example employed in the prior art in relation to the production of an alarm output that indicates the occurrence of encoder failure.

FIG. 2 is a block diagram showing the configuration employed in a first embodiment of the present invention.

FIG. 3 is a block diagram showing the configuration employed in a second embodiment of the present invention.

DETAILED DESCRIPTION

Figure 4:
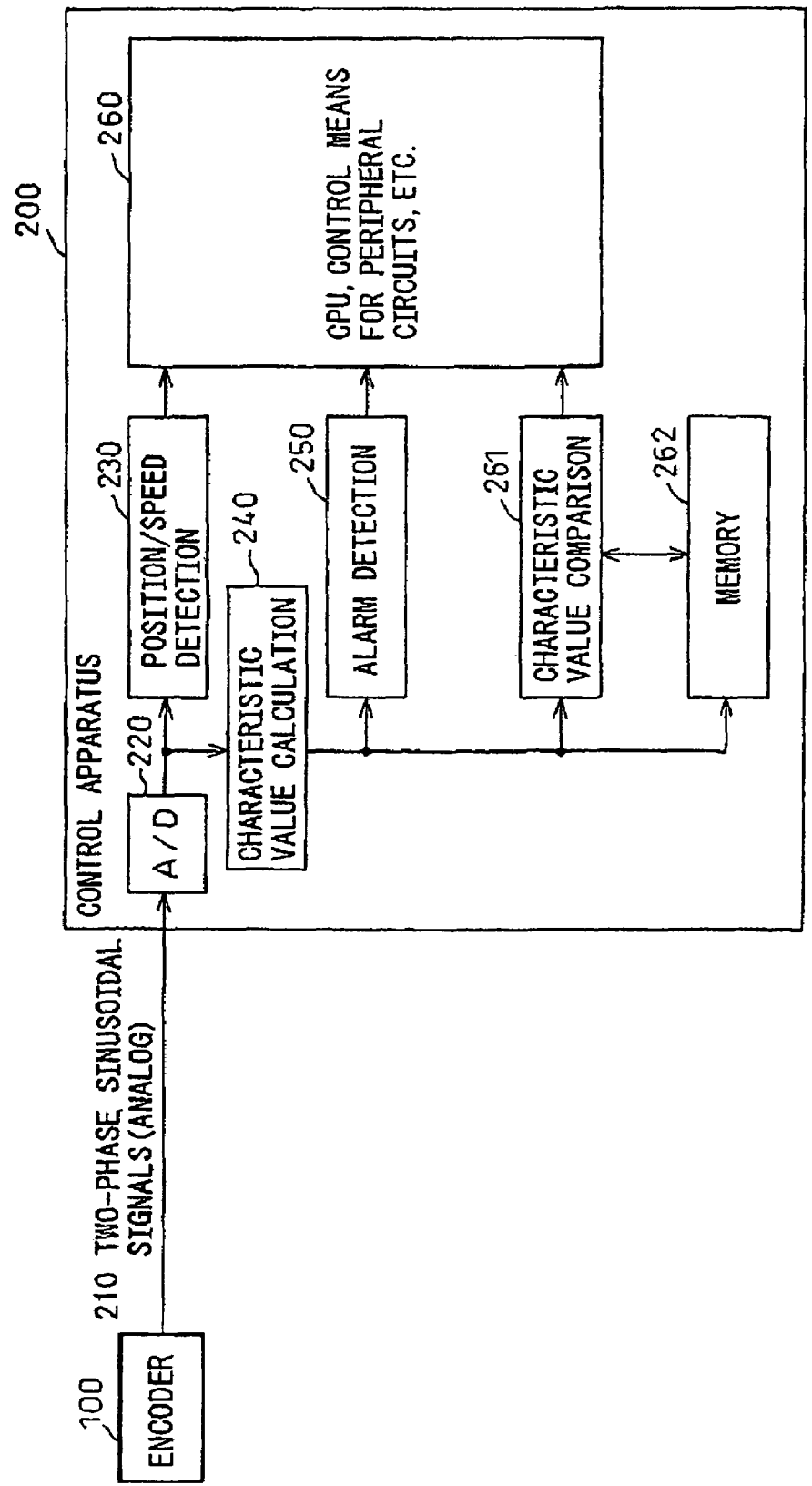
FIG. 4 is a block diagram showing the configuration employed in a third embodiment of the present invention.

Several embodiments of the present invention will be described below with reference to FIGS. 2 to 6. In each of the embodiments, the encoder 100 may be a "rotary encoder" or a "linear encoder", as earlier described.

[Embodiment 1]

First, reference should be made to FIG. 2 which is a block diagram showing the configuration employed in a first embodiment of the present invention. This embodiment corresponds to an improvement on the prior art configuration shown in FIG. 1a; that is, an analog sensor signal 110 generated by a detector (not shown) of the optical or magnetic encoder 100 is converted, in block 120, into a digital signal which is supplied to a position/speed detection circuit ("position/speed detection" block 130) and a "characteristic value calculation" block 140. The sensor signal contains signals of multiple channels such as two-phase sinusoidal signals (phase A and phase B). The "position/speed detection" block 130 obtains position/speed information based on these signals, and transmits the information to an external control apparatus 200 via a serial data transmit/receive control circuit 160. Based on the transmitted position/speed information, the control apparatus 200 performs feedback control, etc. of the motor (not shown) connected to the control apparatus 200.

On the other hand, in the "characteristic value calculation" block 140, characteristic values are calculated repeatedly for the two-phase sinusoidal signals at predetermined intervals of time. For the characteristic values calculated here, various quantities representing the characteristics of the encoder signal can be considered, such as the amplitude value, offset value, or waveform distortion for each phase of the two-phase sinusoidal signals, or the phase difference between the two phase signals, and all or a selected one or several of these quantities are calculated. For these calculated characteristic values, the presence or absence of abnormality is checked by an "alarm detection" block 150, as in the case of the prior art (refer to the description related to FIG. 1a). For example, a common allowable range (from lower limit Vth1 to upper limit Vth2) is set in advance for the offset values of the two-phase sinusoidal signals, and whether the values are inside the allowable range or not is indicated by outputting a "0" (the two phase signals are both inside the allowable range) or a "1" (at least one phase signal is outside the allowable range). This output data is transmitted to the external control apparatus 200 via the serial data transmit/receive control circuit 160. When the "1" signal (at least one phase signal is outside the allowable range) is transmitted, the control apparatus 200 produces an alarm output and notifies the operator of the occurrence of abnormality by means of a visible and/or audible indication.

The configuration and function described up to this point are basically the same as those of the prior art example described with reference to FIG. 1a. The present embodiment differs from the prior art encoder in that the encoder 100 further includes a "memory" (nonvolatile storage device) block 162 for storing the characteristic values and a "characteristic value comparison" block 161, thus making provisions to be able to compare the present characteristic value with the previous characteristic values and transmit the result of the comparison to the control apparatus 200.

The characteristic value is successively stored in the "memory" block 162 at sufficiently short predetermined intervals of time by appending label data indicating the time of storage. Each time the "present characteristic value" is input, the "characteristic value comparison" block 161 compares it with the "previous characteristic values", and transmits the result of the comparison to the control apparatus 200 via the serial data transmit/receive control circuit 160. There are various methods of comparison; among them, the following example will be considered here.

That is, the "characteristic value comparison" block 161 compares the present characteristic value with all the previous characteristic value data that have been accumulated since the start of operation of the encoder 100 (or selected data sampled at predetermined intervals of time) and that is read from the memory 162, calculates the difference between the present characteristic value and each previous characteristic value data, and obtains the largest amount of variation (with plus or minus sign) indicating the largest difference (absolute value). Then, if the absolute value of the largest amount of variation exceeds a predetermined value, a signal indicating "imminent failure" is transmitted to the control apparatus 200 via the serial data transmit/receive control circuit 160. The data of the largest amount of variation (with plus or minus sign) is also transmitted to the control apparatus 200. The control apparatus 200 displays "imminent of failure", for example, on a display, together with the data of the largest amount of variation (with plus or minus sign).

Figure 6:
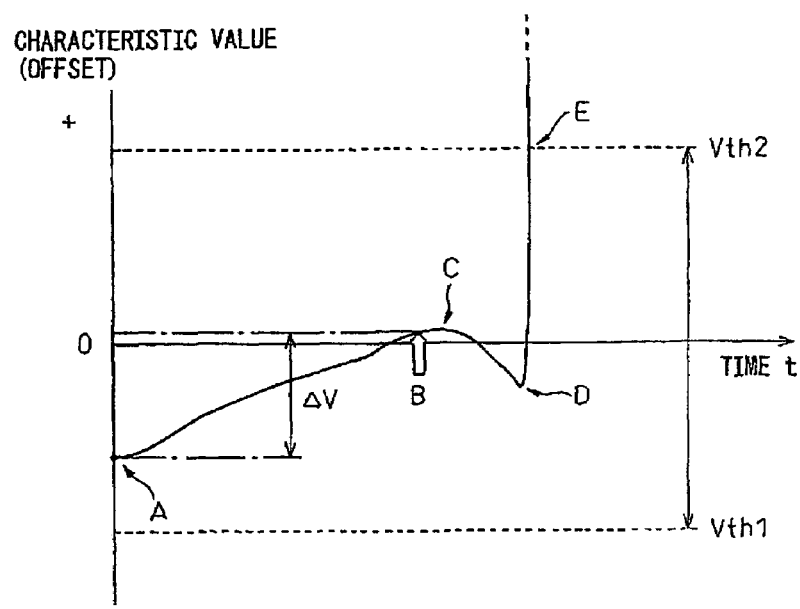
FIG. 6 is a diagram for explaining, by way of example, at which point in time "imminence of failure" can be output.

FIG. 6 is a graph for explaining at which point in time "imminent failure" can be output in the above comparison process. In the graph, the curve drawn from point A shows an example of change for one of the two-phase sinusoidal signals (for example, the phase A signal) during the operation of the encoder 100 from the operation starting point A (time t=0), until an alarm is output because of the occurrence of a failed connection in the encoder signal generating circuit. Ideally, the offset value of each of the two-phase sinusoidal signals should be stable and zero from the start of operation, but in the actual product, there are variations in initial characteristics as well as aging characteristics. As indicated by reference character A, the offset value determined on the initial characteristic is generally not zero. The offset value tends to increase as the operation progresses.

As earlier noted, the allowable range (from lower limit Vth1 to upper limit Vth2) is set in advance for the offset value, and if the value deviates from the allowable range, an alarm signal is transmitted to the control apparatus 200 as in the case of the prior art. When the offset value changes as shown in FIG. 6, the alarm signal is output immediately after the time corresponding to the point indicated by reference character E. However, generally, such an deviation from the allowable range actually occurs after a failure such as a failed connection has actually occurred, and thus the alarm output tends to be produced belatedly. It seems that the alarm can be output earlier if the allowable range (from lower limit Vth1 to upper limit Vth2) is set narrower, but when variations in initial characteristics and aging characteristics existing among individual parts are considered, the allowable range cannot be set very narrow. Setting the allowable range very narrow may result, for example, in intermittent alarm activation even though the encoder is operating normally.

In view of this, in the present embodiment, the "characteristic value comparison" block 161 checks the largest amount of variation (with plus or minus sign) by comparing the present characteristic value with each of the previous characteristic value data accumulated since the start of operation, as described above. Referring to the example of FIG. 6, the offset value gradually rises from the operation starting point A, and begins to fall at the time indicated by reference character C; then, after reaching a minimum value at the time indicated by reference character D, the value rapidly rises and instantly exceeds the upper limit Vth2.

According to an empirical rule, such a change often occurs when a connection is beginning to fail at or near the point C.

Further, in that case, the offset value has a tendency to rise by more than a given value when the value rises from the operation starting point until reaching the point C. Accordingly, "imminent failure" can be detected at the point B where the largest amount of variation exceeds the limit value ΔV. Based on this concept, the "characteristic value comparison" block 161 continues to transmit the "0" signal indicating "no imminent failure" to the control apparatus 200 until the largest amount of variation exceeds the limit value ΔV; then, at the point indicated by reference character B, it transmits the "1" signal indicating the "imminent failure" to the control apparatus 200.

At the same time, the data of the largest amount of variation (with plus or minus sign) obtained at that time is also transmitted to the control apparatus 200. The control apparatus 200 displays "imminent failure", for example, on the display, together with the largest amount of variation (with plus or minus sign). In cases where the reversal in sign of the slope of the characteristic value curve, such as the one occurring at the point indicate by reference character C, may be used as an indication of "imminent failure", as in the above example (such a reversal does not occur during normal operation of the encoder 100), provisions may be made to transmit a notification signal to the control apparatus 200 at the point C where the reversal in sign of the slope of the characteristic value curve occurs. To generalize this, the signal indicating "imminent failure" may be transmit to the control apparatus 200 "when a change that cannot occur during normal operation of the encoder 100 has occurred." Further, when monitoring the two phase signals, the notification may be transmit to the control apparatus 200 when "imminent failure" is detected on at least one of the phase signals.

While the above example has been described by taking the offset value as an example of the characteristic value, it will be recognized that, for other characteristic values, the comparison and monitoring can be performed in the same manner as described above. For example, when the characteristic value is a waveform distortion or a phase difference, the largest variation occurring since the start of operation is monitored and, when its absolute value exceeds the predetermined largest amount of variation, the signal indicating "imminent failure" may be transmitted to the control apparatus 200. If there is more than one characteristic value to be compared and monitored, then when a change indicating "imminent failure" is detected in at least one of the characteristic values, a notification may be sent to the control apparatus 200.

[Embodiment 2]

Reference should be made to FIG. 3 which is a block diagram showing the configuration employed in a second embodiment of the present invention. This embodiment corresponds a modification of the first embodiment; as the basic configuration and function of the encoder 100 are the same as those described in the first embodiment, the description already given will not be repeated here, and the description given hereinafter focuses only on differences. The alarm detection also is the same as that described in the first embodiment.

That is, the characteristic value (such as the amplitude value, offset value, or waveform distortion for each phase of the two-phase sinusoidal signals, or the phase difference between the two phase signals) calculated for each of the two-phase sinusoidal signals in the "characteristic value calculation" block 140 is input to the "alarm detection" block 150 where the presence or absence of abnormality is checked. For example, a common allowable range (from lower limit Vth1 to upper limit Vth2) is set in advance for the offset values of the two-phase sinusoidal signals, and whether the values are inside the allowable range or not is indicated by outputting a "0" (the two phase signals are both inside the allowable range) or a "1" (at least one phase signal is outside the allowable range). This output data is transmitted to the external control apparatus 200 via the serial data transmit/receive control circuit 160, and the control apparatus 200 notifies the operator of the occurrence of abnormality by means of a visible and/or audible indication.

One feature of the present embodiment is the provision of a block for generating a reference sensor signal 163; the sensor signal generated here is A/D converted in a block 164, and its characteristic value is calculated in a block 165 and used in the "characteristic value comparison" block 161. That is, in the "characteristic value comparison" block 161, each time the characteristic value (present value) is calculated for the position/speed measuring sensor signal, the value is compared with the characteristic value (reference value) calculated for the reference sensor signal, and the result of the calculation, that is to say the comparison result, is stored in the memory. Here, for at least one characteristic value, if the difference between the characteristic value and the reference value deviates from a predetermined range, a notification of the deviation as "imminent failure" is transmitted to the control apparatus 200.

The signal A/D converted from the reference sensor signal 163 in the block 164 may be temporarily stored in the memory 162 as indicated by "*1" in FIG. 3, and then may read out in the "characteristic value comparison" block 161, or may be directly input to the "characteristic value comparison" block 161 as indicated by "*2". The output source of the reference sensor signal 163 (the reference encoder signal generating source) can be constructed using a waveform generator that generates two-phase sinusoidal signals controlled to have characteristic values (amplitude value, offset value, waveform distortion, and phase difference) that correspond the initial characteristics of the encoder 100.

In the present embodiment, by generating the reference sensor signal so as to reflect the initial characteristics of that particular encoder, detection of the "imminent failure" can be achieved, as in the first embodiment.

[Embodiment 3]

Reference should be made to FIG. 4 which is a block diagram showing the configuration employed in a third embodiment of the present invention. This embodiment corresponds to an improvement on the prior art configuration shown in FIG. 1b; that is, in the present embodiment, the characteristic value comparison and monitoring performed in the first embodiment is performed in the control apparatus 200. The basic configuration and function of the encoder 100 are the same as those of the prior art shown in FIG. 1b. The alarm detection also is the same as that of the prior art shown in FIG. 1b.

That is, an analog encoder signal 210 containing the two-phase sinusoidal signals generated by a detector of the encoder 100 is transmitted to the external control apparatus 200. In the control apparatus 200, the received signal is A/D converted in a block 220, and position/speed information is obtained based on the A/D converted signal. Then, based on the position/speed information, a block 260 indicated as "CPU, control means for peripheral circuits, etc." performs feedback control, etc. of the motor (not shown) connected to the control apparatus 200.

The A/D converted encoder signal is also input to a "characteristic value calculation" block 240 where the characteristic value (for example, the offset value) of the encoder signal is calculated. The characteristic value (for example, the offset value) thus calculated is processed by an "alarm detection" block 250; if it is determined that an abnormality has occurred, an alarm output is produced to notify the operator of the occurrence of the abnormality by means of a visible and/or audible indication. The criterion for outputting the alarm is the same as that described with reference to FIG. 1a. That is, for the two-phase sinusoidal signals, for example, the offset value is checked at extremely short predetermined intervals of time (ITP) and, if the offset value is outside the predetermined allowable range (from lower limit Vth1 to upper limit Vth2), the alarm output is produced.

On the other hand, the characteristic value (such as the amplitude value, offset value, or waveform distortion for each phase of the two-phase sinusoidal signals, or the phase difference between the two phase signals) calculated in the "characteristic value calculation" block 240 in the control apparatus 200 is input to a "memory" block 262 as well as to a "characteristic value comparison" block 261. The characteristic value is successively stored in the "memory" block 262 at sufficiently short predetermined intervals of time by appending label data indicating the time of storage. Each time the "present characteristic value" is input, the "characteristic value comparison" block 261 compares it with the "previous characteristic values", and analyzes the result of the comparison.

The comparison can be performed in the same manner as in the first embodiment. That is, the "characteristic value comparison" block 261 compares the present characteristic value with all the previous characteristic value data that have been accumulated since the start of operation of the encoder 100 (or selected data sampled at predetermined intervals of time) and that is read from the memory 262, calculates the difference between the present characteristic value and each previous characteristic value data, and obtains the largest amount of variation (with plus or minus sign) indicating the largest difference (absolute value). Then, if the absolute value of the largest amount of variation exceeds a predetermined value, a signal indicating "imminent failure" is output, and is displayed, for example, on a display (not shown) together with the data of the largest amount of variation (with plus or minus sign). By performing such comparison, an "imminent failure" can be detected at a relatively early stage, as in the first embodiment described with reference to FIG. 6.

For example, in the case of the characteristic value (offset value) change shown in FIG. 6, an "imminent failure" can be detected at the point B or point C which is much earlier than the point indicated by reference character E at which the alarm signal is output.

[Embodiment 4]

Figure 5:
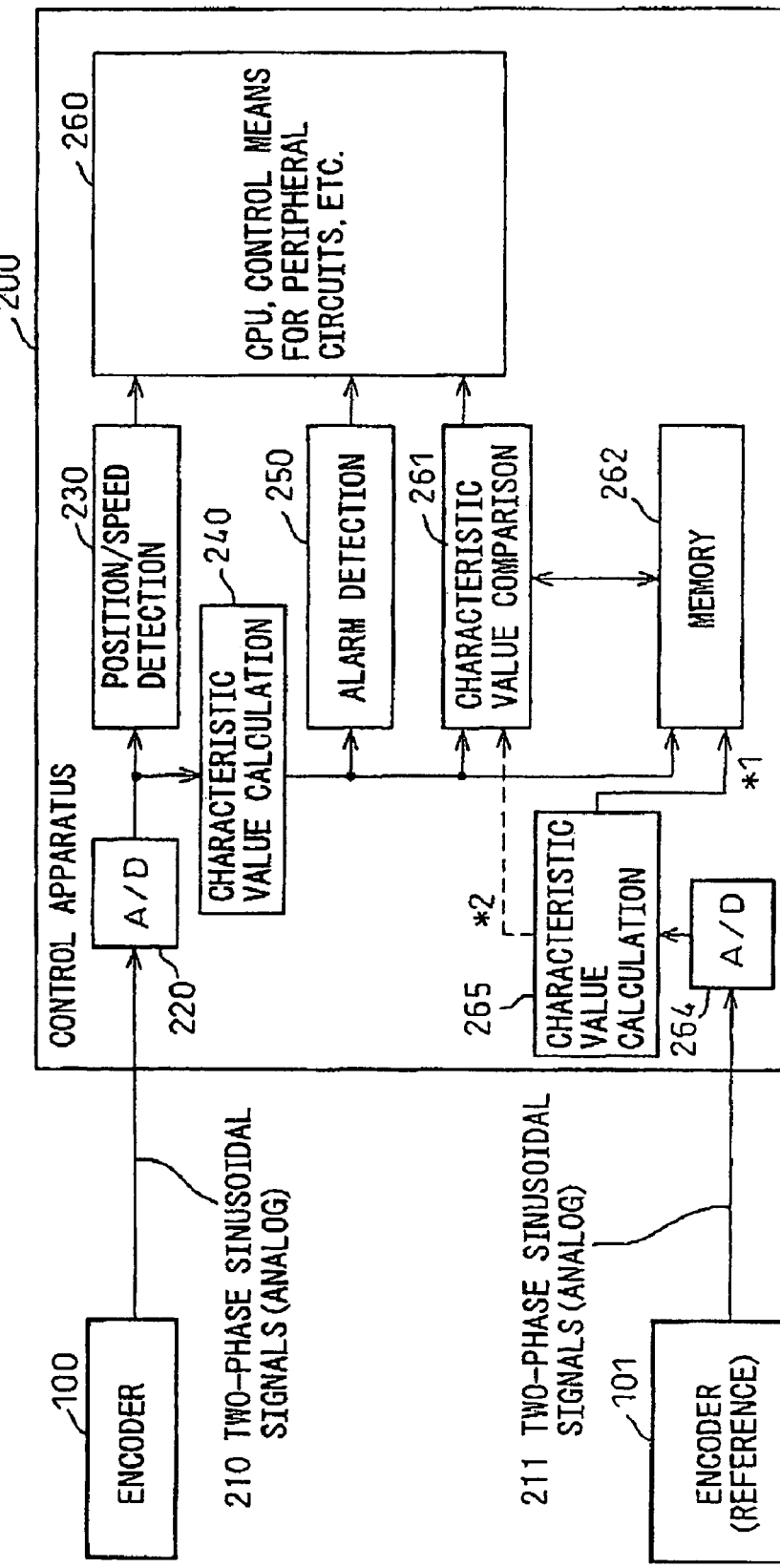
FIG. 5 is a block diagram showing the configuration employed in a fifth embodiment of the present invention.

Reference should be made to FIG. 5 which is a block diagram showing the configuration employed in a fourth embodiment of the present invention. In this embodiment, the characteristic value comparison and monitoring performed in the second embodiment is performed in the control apparatus 200 and, thus, the present embodiment concerns a modification of the foregoing third embodiment. The basic configuration and function of the encoder 100 are the same as those of the third embodiment, and the alarm detection also is the same as that of the third embodiment.

That is, the analog encoder signal 210 containing the two-phase sinusoidal signals generated by the detector of the encoder 100 is A/D converted in the block 220 in the control apparatus 200 and, based on this A/D converted signal, the block 230 obtains the position/speed information. Then, based on the position/speed information, the block 260 indicated as "CPU, control means for peripheral circuits, etc." performs feedback control, etc. of the motor (not shown) connected to the control apparatus 200.

On the other hand, the characteristic value (such as the amplitude value, offset value, or waveform distortion for each phase of the two-phase sinusoidal signals, or the phase difference between the two phase signals) calculated for each of the two-phase sinusoidal signals in the "characteristic value calculation" block 240 is input to the "alarm detection" block 250 in the control apparatus 200 where the presence or absence of abnormality is checked. For example, a common allowable range (from lower limit Vth1 to upper limit Vth2) is set in advance for the offset values of the two-phase sinusoidal signals, and whether the values are inside the allowable range or not is indicated by outputting a "0" (the two phase signals are both inside the allowable range) or a "1" (at least one phase signal is outside the allowable range). When the latter is output, the control apparatus 200 notifies the operator of the occurrence of abnormality by means of a visible and/or audible indication.

The present embodiment is the same as the second embodiment (see FIG. 3) in that the block 101 for generating a reference sensor signal 211 (reference encoder signal) is provided. However, in the present embodiment, the reference encoder signal generating source 101 is provided outside the encoder 100, and the sensor signal 211 generated there is supplied to the control apparatus 200 where it is A/D converted in a block 264. Then, its characteristic value is calculated in a block 265 in the control apparatus, and this value is used in the "characteristic value comparison" block 261. In the "characteristic value comparison" block 261, each time the characteristic value (present value) calculated for the position/speed measuring sensor signal supplied from the encoder 100 is input, the value is compared with the characteristic value (reference value) calculated for the reference encoder signal, and the result of the calculation, that is to say the comparison result, is stored in the memory 262. Here, for at least one characteristic value, if the difference between the characteristic value and the reference value deviates from a predetermined range, a notification of the deviation as an "imminent failure" is transmitted to the control apparatus 200.

Here, the A/D converted reference sensor signal 211 (reference encoder signal) may be temporarily stored in the memory 262 as indicated by "*1" in FIG. 5, and then may read out in the "characteristic value comparison" block 261, or may be directly input to the "characteristic value comparison" block 261 as indicated by "*2".

As in the second embodiment, the output source of the reference sensor signal 211 (the reference encoder signal generating source) can be constructed using a waveform generator that generates two-phase sinusoidal signals controlled to have characteristic values (amplitude value, offset value, waveform distortion, and phase difference) that correspond the initial characteristics of the encoder 100. In the present embodiment, by generating the reference sensor signal 211 so as to reflect the initial characteristics of that particular encoder, detection of the "imminence of failure" can be achieved, as in the first embodiment.

Although the invention has been shown and described with exemplary embodiments thereof, it should be understood by those skilled in the art that the foregoing and various other changes, omissions and additions may be made therein and thereto without departing from the spirit and scope of the invention.

What is claimed is:

1. An encoder to be attached to a motor or a motor-driven apparatus and used for detecting position information or speed information, comprising:
    storage means for storing an encoder signal characteristic value obtained from a digital quantity into which an analog encoder signal generated within the encoder has been converted;
    comparison means for comparing the characteristic value stored in the storage means with a characteristic value obtained from a digital quantity into which a present encoder signal has been converted; and
    means for notifying a comparison result output from the comparison means to a control apparatus of the motor.

2. An encoder as claimed in claim 1, wherein the analog encoder signal comprises two substantially sinusoidal signals approximately 90 degrees apart in phase, and
    the characteristic value includes at least one value selected from values representing amplitude, offset, and waveform distortion of each of the two encoder signals and phase difference between the two encoder signals.

3. An encoder to be attached to a motor or a motor-driven apparatus and used for detecting position information or speed information, comprising:
    means for generating an analog encoder signal that serves as a reference;
    storage means for storing a reference encoder signal characteristic value obtained from a digital quantity into which the reference encoder signal has been converted;
    comparison means for comparing the characteristic value stored in the storage means with a characteristic value obtained from a digital quantity into which an analog encoder signal generated within the encoder has been converted; and
    means for notifying a comparison result output from the comparison means to a control apparatus of the motor.

4. An encoder as claimed in claim 3, wherein the analog encoder signal comprises two substantially sinusoidal signals approximately 90 degrees apart in phase, and
    the characteristic value includes at least one value selected from values representing amplitude, offset, and waveform distortion of each of the two encoder signals and phase difference between the two encoder signals.

5. An encoder to be attached to a motor or a motor-driven apparatus and used for detecting position information or speed information, comprising:
    means for generating an analog encoder signal that serves as a reference;
    comparison means for comparing a characteristic value obtained from a digital quantity into which the reference encoder signal has been converted, with a characteristic value obtained from a digital quantity into which a present analog encoder signal generated within the encoder has been converted; and
    means for notifying a comparison result output from the comparison means to a control apparatus of the motor.

6. An encoder as claimed in claim 5, wherein the analog encoder signal comprises two substantially sinusoidal signals approximately 90 degrees apart in phase, and
    the characteristic value includes at least one value selected from values representing amplitude, offset, and waveform distortion of each of the two encoder signals and phase difference between the two encoder signals.

7. An encoder to be attached to a motor or a motor-driven apparatus and used for detecting position information or speed information, comprising:
    storage means for storing an encoder signal characteristic value obtained from a digital quantity into which an analog encoder signal generated within the encoder has been converted;
    comparison means for comparing, at predetermined intervals of time, the characteristic value stored in the storage means with a characteristic value obtained from a digital quantity into which a present encoder signal has been converted; and
    means for notifying a comparison result output from the comparison means to a control apparatus of the motor.

8. An encoder as claimed in claim 7, wherein the analog encoder signal comprises two substantially sinusoidal signals approximately 90 degrees apart in phase, and
    the characteristic value includes at least one value selected from values representing amplitude, offset, and waveform distortion of each of the two encoder signals and phase difference between the two encoder signals.

9. A control apparatus which receives and analyzes an analog encoder signal generated within an encoder that is attached to a motor or a motor-driven apparatus and is used for detecting position information or speed information, and which thereby controls the motor, comprising:
    storage means for storing an encoder signal characteristic value obtained from a digital quantity into which the encoder signal has been converted;
    comparison means for comparing the characteristic value stored in the storage means with an encoder signal characteristic value obtained from a digital quantity into which a present analog encoder signal generated within the encoder has been converted; and
    means for analyzing a comparison result output from the comparison means.

10. A control apparatus as claimed in claim 9, wherein the analog encoder signal comprises two substantially sinusoidal encoder signals approximately 90 degrees apart in phase, and
    the characteristic value includes at least one value selected from values representing amplitude, offset, and waveform distortion of each of the two encoder signals and phase difference between the two encoder signals.

11. A control apparatus which receives and analyzes an analog encoder signal generated within an encoder that is attached to a motor or a motor-driven apparatus and used for detecting position information or speed information, and which thereby controls the motor, comprising:
    storage means for storing an encoder signal characteristic value obtained from a digital quantity into which an analog reference encoder signal that serves as a reference has been converted;
    comparison means for comparing the characteristic value stored in the storage means with an encoder signal characteristic value obtained from a digital quantity into which a present analog encoder signal generated within the encoder has been converted; and
    means for analyzing a comparison result output from the comparison means.

12. A control apparatus as claimed in claim 11, wherein the analog encoder signal comprises two substantially sinusoidal encoder signals approximately 90 degrees apart in phase, and the characteristic value includes at least one value selected from values representing amplitude, offset, and waveform distortion of each of the two encoder signals and phase difference between the two encoder signals.

13. A control apparatus which receives and analyzes an analog encoder signal generated within an encoder that is attached to a motor or a motor-driven apparatus and used for detecting position information or speed information, and which thereby controls the motor, comprising:

comparison means for comparing a reference encoder signal characteristic value obtained from a digital quantity into which an analog reference encoder signal that serves as a reference has been converted, with a characteristic value obtained from a digital quantity into which a present analog encoder signal generated within the encoder has been converted; and means for analyzing a comparison result output from the comparison means.

14. A control apparatus as claimed in claim 13, wherein the analog encoder signal comprises two substantially sinusoidal encoder signals approximately 90 degrees apart in phase, and the characteristic value includes at least one value selected from values representing amplitude, offset, and waveform distortion of each of the two encoder signals and phase difference between the two encoder signals.

15. A control apparatus which receives and analyzes an analog encoder signal generated within an encoder that is attached to a motor or a motor-driven apparatus and used for detecting position information or speed information, and which thereby controls the motor, comprising:

storage means for storing an encoder signal characteristic value obtained from a digital quantity into which the encoder signal has been converted;

comparison means for comparing, at predetermined intervals of time, the characteristic value stored in the storage means with a characteristic value obtained from a digital quantity into which a present encoder signal has been converted; and means for analyzing a comparison result output from the comparison means.

16. A control apparatus as claimed in claim 15, wherein the analog encoder signal comprises two substantially sinusoidal encoder signals approximately 90 degrees apart in phase, and the characteristic value includes at least one value selected from values representing amplitude, offset, and waveform distortion of each of the two encoder signals and phase difference between the two encoder signals.

* * * * *